United States Patent [19]

Garretson et al.

[11] Patent Number: 4,623,839
[45] Date of Patent: Nov. 18, 1986

[54] PROBE DEVICE FOR TESTING AN INTEGRATED CIRCUIT

[75] Inventors: Oliver R. Garretson, Woughton Park; Gordon W. Watson, North Hill, both of United Kingdom

[73] Assignee: Angliatech Limited, Lancaster, England

[21] Appl. No.: 532,365

[22] Filed: Sep. 15, 1983

[30] Foreign Application Priority Data

Sep. 17, 1982 [GB] United Kingdom ................. 8226517

[51] Int. Cl.$^4$ ........................................... G01R 1/073
[52] U.S. Cl. .................................... 324/158 P; 29/843
[58] Field of Search ................... 324/158 P, 158 F; 29/825, 842, 843, 830, 850, 877, 884

[56] References Cited

U.S. PATENT DOCUMENTS 3,560,907  2/1971  Heller ........................... 339/176 X
3,952,410  4/1976  Garretson ........................... 29/628

FOREIGN PATENT DOCUMENTS 55-23437  2/1980  Japan ........................... 324/158 P
56-81454  7/1981  Japan ........................... 324/158 P

OTHER PUBLICATIONS

Probe-Rite Products Catalog, 1975.
IBM Technical Disclosure Bulletin, Drzewinski, G., et al., "Multipoint Circuit Probe", vol. 18, No. 8, Jan. 1976, pp. 2453–2454.
IBM Technical Disclosure Bulletin, Watson, R., "Quadrant Probe", vol. 14, No. 1, Jun. 1971, pp. 217–218.
IBM Technical Disclosure Bulletin, Byrnes., H., et al., "Deletable Template Method of Test Probe Assembly", vol. 21, No. 5, Oct. 1978, p. 1874.

*Primary Examiner*—Reinhard J. Eisenzopf
*Assistant Examiner*—Stephen M. Baker
*Attorney, Agent, or Firm*—Hamrick, Hoffman, Guillot & Kazubowski

[57] ABSTRACT

A plurality of probes for contacting the pads of an integrated circuit are cantilevered within the aperture of a ceramic ring. The probes are fixed to the ring with an adhesive and a second ceramic ring is positioned on them to support them against contact forces. The probes are soldered to conductive tracks on the first ring for connection to test apparatus, providing a very rigid and dimensionally accurate and stable probe arrangement. The device can be constructed with the probes in contact with a sample integrated circuit, in a quick and simple process.

17 Claims, 13 Drawing Figures

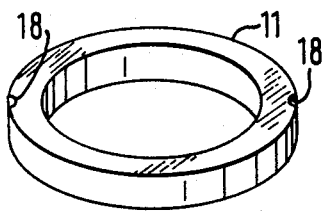
FIG. 4.
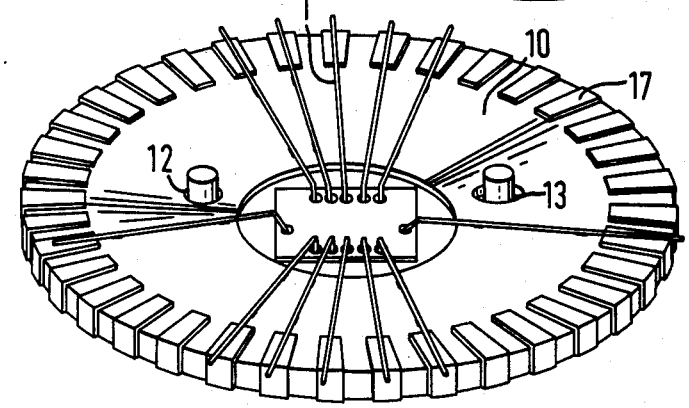
FIG. 5a. 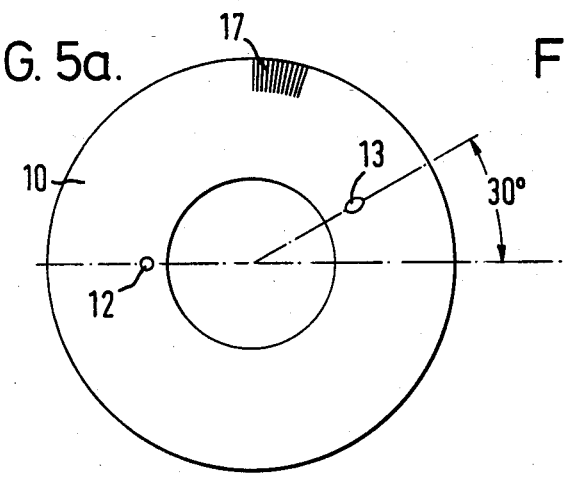 FIG. 5b. 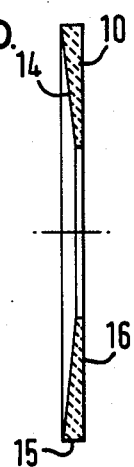

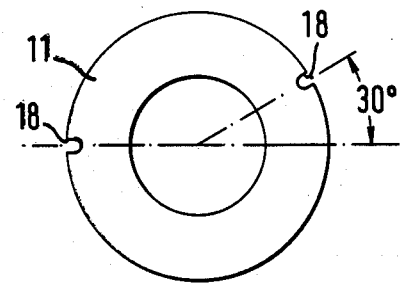
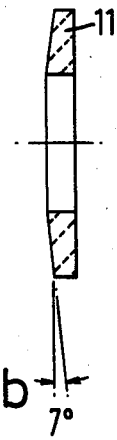
FIG. 6a  FIG. 6b
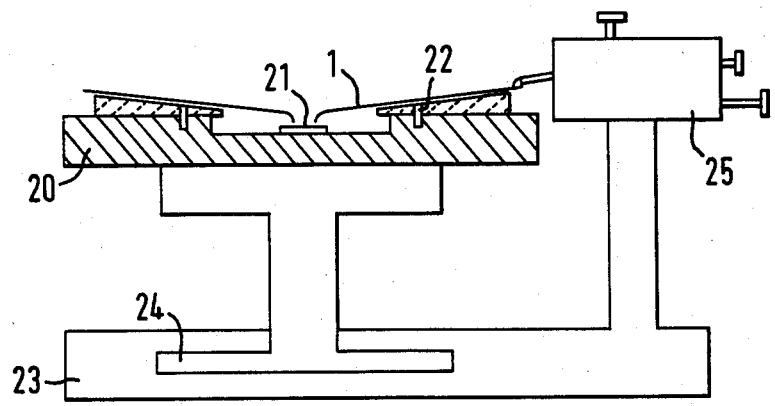
FIG. 7

PROBE DEVICE FOR TESTING AN INTEGRATED CIRCUIT

This invention relates to a probe device for testing an integrated circuit and to a method of manufacturing same.

A probe device is used for contacting the conductive pads on an integrated circuit for the purpose of connecting the pads to an automatic testing machine. The device includes a plurality of probes equal in number to at least the number of pads with which it is desired to make a connection. The probes are usually supported in a ring and extend radially towards the centre of the ring, their inner tips then turning to make a small acute angle, conventionally 4°, to the axis of rotational symmetry of the ring. The tips normally lie in the same plane. The probe device forms a replaceable part of a testing machine: it has to be replaced by a similar device for cleaning after a limited number of test operations have been carried out and of course if it is desired to test a different kind of integrated circuit a new probe device with a different arrangement of probe tips is required.

A conventional probe device is shown in FIG. 1 and comprises the plurality of probes 1 carried by a ring 2 of anodised aluminium or the like. The ring is secured to the backs of the probes, i.e. the side axially away from the tips and the device under test, by means of an epoxy resin 3. The ring is carried by a printed circuit board 4 forming a test card which carries conductors terminating at one end in a ring arrangement near the probes. The radially outer ends 5 of the probes are soldered to respective conductors and the card may then be inserted in the test apparatus so that there is an electrical connection between the test apparatus and the pads of the integrated circuit, generally referred to as a die. A typical method of making such a probe device is as follows: a wafer having a number of dice is placed on a microscope stage which is movable in its own plane. A piece of Mylar (RTM) or like material is held on the stage by a vacuum chuck, e.g. at one side of the wafer, so as to move with the stage. A punch is located adjacent the Mylar sheet and fixed with respect to the microscope. The stage is moved so that one of the pads appears at the centre of the viewing area of the microscope and the punch is then operated to punch a hole in the Mylar sheet. This is repeated for each of the pads until there is a pattern of holes in the sheet corresponding to the pattern of pads. A disc containing a pattern of holes is then punched out of the Mylar sheet and forms a template for the next steps in the manufacture of the probe device.

The next step is illustrated in FIG. 2 of the accompanying drawings. The Mylar disc 6 is mounted in a building fixture 7 and the probes 1 are positioned with their tips in the holes of the disc, one probe tip in each hole. A coating of an epoxy resin is applied to the above-mentioned ring 2 and the ring is positioned carefully above the array of probes and then gently dropped onto them and optionally a weight placed thereon. The structure thus formed is then baked in an oven to cure the epoxy resin and after removal from the oven the assembly of probes and ring, i.e. a probe ring, is stripped from the Mylar disc which remains attached to the building fixture. The probe ring can then be bonded to a test card 4 by, for example, a cyanoacrylate adhesive and the radially outer ends 5 of the probes soldered to the conductors of the test card.

This method has many disadvantages. It is very slow and the typical manufacture time of the finished probe device is about 6 hours. Furthermore, until a substantial part of the manufacture has been carried out, it is not possible to test to see if the device so far formed is satisfactory. Something like two thirds of the manufacturing time has typically elapsed before the device can be tested. This is particularly serious because of the high failure rate in manufacture, which can result in as many as 40% of the devices being faulty. Furthermore it is essential to remove surplus resin which may be present radially within the ring if the device is to operate with the correct tip pressure. A further limitation in this type of production is the number of probes that it is possible to mount using the above method: more than 120 probes are virtually impossible to assemble for manufacture. Another major disadvantage is that successive cards produced by the method exhibit substantial variations in their dimensions, particularly the distance between the test card and the probe tips. The ring 2 may not be positioned quite correctly, especially when differing probe lengths are used, the thickness of the epoxy may vary during curing and some of the probes may even move during curing. The tips of the probes are often ground back to a point of standard diameter and the amount of material removed in the axial direction may vary because it is difficult to fix accurately the depth of insertion of the probe tips through the holes in the Mylar disc. Variations in the dimensions mean that each time a card is changed time-consuming adjustments have to be made to the testing machine.

Further, the printed circuit board 4 is relatively flexible and cannot keep the probes in accurate alignment. For example, during operation of a testing machine stresses are imposed on the board 4 which then bends causing movement of the probe tips. Long term changes in the positions of the tips also occur.

Viewed from one aspect, the invention provides a probe device for testing an integrated circuit, comprising a dielectric ring of which one axial face is inclined to the axis in a conical manner, a plurality of probes positioned on said inclined face with their contact tips radially within the aperture in the ring, and a second dielectric ring, having a generally complementary inclined face, positioned on the probes whereby the probes are retained between the two rings.

The probes may be conventional etched tungsten wire probes.

This form of construction has the advantage of ease of manufacture as will be described and provides the possibility of accurately setting the distance from the probe tips to the second ring.

The dielectric rings are preferably ceramic, which affords good dimensional stability and a high and maintainable dielectric constant. They may also be raised to high temperatures which is an advantage in a preferred form of the invention, in which a plurality of conductive tracks for the respective probes are formed directly on the first-mentioned dielectric ring. Very low resistance tracks may be formed by spraying and baking metal onto the ceramic and then plating. The tracks on the ring may extend along the cylindrical outer edge of the ring and along the other axial face, allowing many possible connection techniques to be employed, e.g. soldering to a printed circuit board or direct connection with a circular edge connecting device without the use of a printed circuit board. The probe device may be held by the second ring in use on a testing machine, which allows very accurate positioning, and the connection to the testing circuit may be made very close to the integrated circuit. It will be seen that the probes are soldered to a rigid ring rather than a relatively flexible printed circuit board and therefore the dimensional stability of the probe tips is greatly improved.

The invention also provides a method of making a probe device for testing an integrated circuit, comprising positioning a dielectric ring adjacent and around an integrated circuit of the kind to be tested, positioning a probe with a manipulator device such that the probe lies on or over the dielectric ring and its tip contacts the desired part of the integrated circuit radially within the aperture in the ring, securing the probe to the ring with an adhesive, likewise positioning and securing the other probes, and securing a second dielectric ring to the probes whereby the probes are secured between the two rings. Clearly this method avoids the need to prepare a punched Mylar disc and the dimensional problems associated with such discs. Further the positioning of the probes can be checked, and corrected if necessary, at an early stage in the process, i.e. after any or all of the probes have been positioned and secured.

The first-mentioned ring is preferably provided with a series of generally radial conductive tracks on the surface to which the probes are secured; the probes may then be soldered to the tracks to make the necessary connections. The soldering step is preferably carried out and the device checked before the second ring is secured in position. Alternatively, the probes can be fixed in position and then checked and then the second ring secured in position and the probe positions checked again. At this stage some small adjustments can be made as the adhesive is thermosensitive and will allow a little movement on heating. The probes are then soldered to the first ring. In the unlikely event that any movement occurred during soldering, this can be corrected by bending the probe tip.

The second ring is preferably secured to the first ring and the probes by means of an epoxy resin and the axial position of the second ring relative to the probe tips may be accurately selected. This avoids the problems associated with the dimensional variations in the prior art. Because the positions of the probe tips are accurately and correctly set, no grinding of the tips is required. Further, because of the rigidity of the ceramic, the problem of dimensional variations experienced with the prior art printed circuit boards is overcome.

An embodiment of the invention will now be described by way of example and with reference to the accompanying drawings, in which:

FIG. 1, described above, is a sectional elevation of a prior art probe device;

FIG. 2, described above, is a sectional elevation showing a stage in the manufacture of the probe device of FIG. 1;

FIG. 4 is an exploded perspective view of the probe device of FIG. 3 during manufacture;

FIGS. 5a and 5b are plan and sectional elevation views of the lower ring of FIG. 3;

FIGS. 6a and 6b are plan and sectional elevation views of the upper ring of FIG. 3;

FIG. 7 is a schematic sectional view illustrating an apparatus and method for making the probe device of FIG. 3;

Referring to FIGS. 3 to 6, the probe device comprises a lower dielectric ring 10, an upper dielectric ring 11, and a plurality of probes 1. The rings 10 and 11 are made of a ceramic material.

Figure 1:
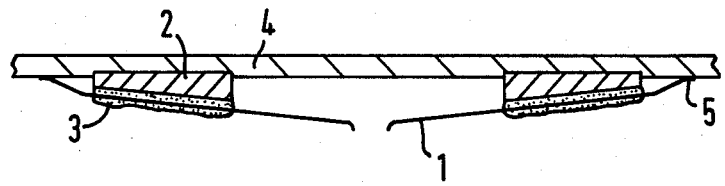
Figure 2:
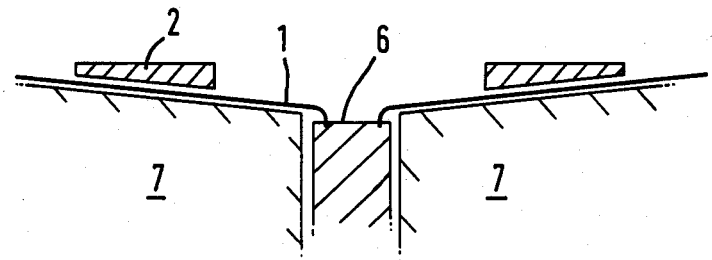
Figure 3:
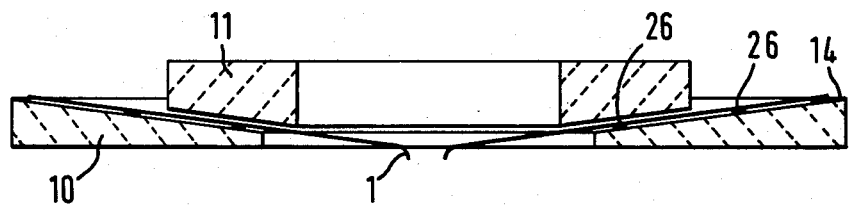
FIG. 3 is a sectional elevation of a probe device according to the invention.

In this example the ring 10 has an internal diameter of 15 mm and an external diameter of 38 mm. The upper axial face 14 in FIG. 3 is inclined to the axis in a conical manner: in this example the minimum thickness is 0.4 mm and the angle of taper is 7°. The ring 10 is provided with a 1.1 mm diameter hole 12 and an elongate hole 13 about 1.1 mm by 1.5 mm. The holes 12 and 13 are positioned on a circle of radius 20 mm and are for the purpose of receiving dowel pins. A plurality of thin conductive tracks 17 are provided on the face 14. The tracks may be made by any suitable process, including a thick film printing technique, vapour deposition and etching, or spraying and baking metal and then plating. Specifically, metal could be vapour deposited through a mask to yield individual tracks; or deposited in bulk and unwanted metal etched, abraded or laser cut away. In this example 120 tracks are provided but only a few of them are illustrated. A greater or lesser number may be provided as required. As may be seen from FIG. 5b, the minimum thickness of the ring 10 is nearest its centre. The minimum thickness in one example is 0.4 mm but a variety of thicknesses may be used to accommodate dice of different sizes as explained below.

The ring 11 is of 24 mm outer diameter and 12 mm inner diameter so that the inner diameter is smaller than that of the ring 10 as shown in FIG. 3. In another version, a 15 mm inner diameter may be used to match that of the ring 10. In either case the minimum thickness, which as may be seen in FIG. 6b is at the outer edge, is 2 mm and the lower face in FIG. 3 is inclined at 7° to match the face 14 of the ring 10. The ring 11 is provided with two slots 18 of 1.1 mm width extending in to a 20 mm diameter circle, again for the reception of dowels.

The probe device of FIG. 3 may be manufactured as follows: the ring 10 is mounted on a fixture 20 (FIG. 7) surrounding a die 21 of the kind to be tested and is located by dowels 22. The fixture 20 is supported in a base 23 via a detent mechanism 24 which allows the fixture 20 to be indexed by amounts corresponding to the spacing of the tracks 17. An x,y,z manipulator 25 is also mounted on the base 23. A first probe 11 is positioned by use of the manipulator such that its tip contacts the desired pad on the die and such that it overlies one of the tracks 17. When the probe is precisely positioned it is fixed in position, e.g. by two drops 26 (FIG. 3) of cyanoacrylate adhesive. The other probes are then positioned and secured in the same manner. At this stage the alignment and layout of the probes can be checked and if necessary adjusted. When all of the probes are in the correct position they are soldered to the respective tracks 17 using a solder cream and hot nitrogen. At this stage a further check to verify that all of the probes have remained in the correct alignment may be carried out. For ease of handling by the manipulator, the probes 1 may be made so long that they extend radially outwardly beyond the edge of the ring 10 and they may be cut off after they are soldered.

The second ring 11 is then secured to the probes 1 and first ring 10. This operation may be carried out by positioning the ring 10 and probes 1 in another assembly fixture which has a guide having dowels for locating in slots 18 and is arranged to guide the ring 11 coaxially down towards the ring 10. The ring 11 is coated with a metered amount of adhesive on its inclined lower surface and lowered into position on top of the probes. A stop may be provided to determine the position of the ring 11 with respect to the probe tips with great accuracy. It is possible to fix the position of the top surface of the ring 11 and the bottom surface of the ring 10 with respect to the probe tips with an accuracy of about a thousandth of an inch (0.025 mm).

As an alternative, the probes could be fixed to the ring 10 and checked and then the ring 11 fixed. The alignment could be rechecked and then the probes soldered to the tracks.

As may be seen from FIGS. 3 and 7, if a larger die is to be tested, the probe tips must be moved radially away from the axis of the ring 10 and they therefore move up the inclined face 14. To compensate for this thinner rings 10 may be used and in addition to the one of minimum thickness 0.4 mm it has been found useful to provide rings of minimum thickness 0.25 mm and 0.1 mm for use in testing larger dice. The fixture 20 may be provided with a variety of depth positions for the die 21; e.g. six different depths may be provided to accommodate dice of different thicknesses. Semiconductor wafers vary in thickness and in general a larger wafer will be thicker so that it has the strength to support its own weight.

Figure 8:
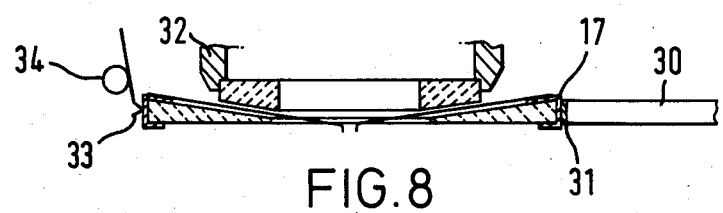
FIG. 8 is a schematic sectional view illustrating two possible ways of connecting to the probe device in use in a testing machine.
Figure 9:
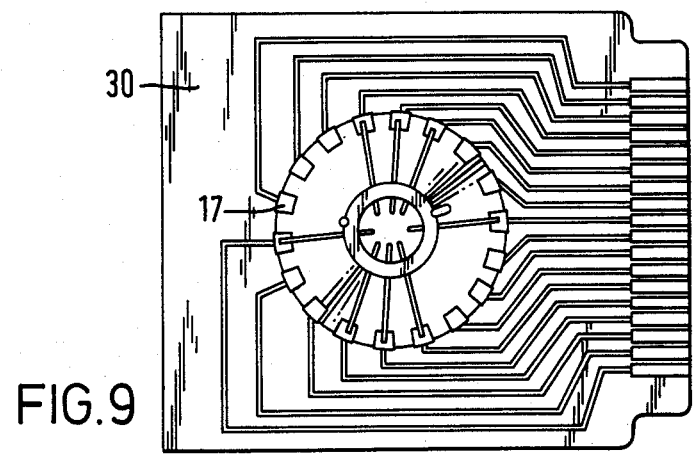
FIG. 9 illustrates the mounting of a probe device in a test card.

The use of a probe device according to the invention in a testing machine will now be described with reference to FIGS. 8 and 9. The left-hand side of FIG. 8 shows one technique and the right-hand side another. If desired, the probe device may be fitted into an aperture in a printed circuit board 30 and tracks on the board 30 may be soldered to the tracks 17 as shown at 31. The board 30 may be used to carry and locate the probe device in the conventional manner. Preferably, however, a chuck 32 carries the probe device via the ring 11. The chuck may be vacuum operated and accurately positions the ring in the axial direction, e.g. by means of a stop, and in the circumferential direction, e.g. by means of pins or protrusions which engage the slots 18. The connections may still be made via a printed circuit board 30, but advantageously a flexible printed circuit board is used to carry the connections. As an alternative, the printed circuit board 30 may be dispensed with entirely and connections made by means of a plurality of contacts 33 disposed in a ring around the point at which the probe device is located in use. By way of example, an inflatable ring 34 may be used to urge the contacts 33 against the respective tracks 17 when the probe device is in position. This arrangement allows the probe device to be positioned very accurately by a machine with simple controls and also permits testing circuitry to be connected very close to the die under test.

Figure 10:
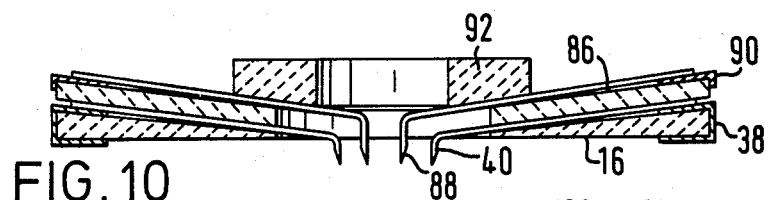
FIG. 10 is a cross-section of another embodiment of a probe device that utilizes a double layer to facilitate connection to staggered or matrixed pads.

When the contact pads of an integrated circuit are in double rows, or very close together another alternative embodiment of the probe disk may be utilized which provides double layers of probes, as shown in FIG. 10. In this case, the first layer of probes 40 are installed as described above to contact the outermost contact pads. Upon completion, a ring 86 is bonded to the top of the first layer of probes as was ring 11. Ring 86 permits a second layer of probes 88 to be installed by adhesive bonding. The upper probes 88 contact the inner contact pads of the integrated circuit and are soldered to a second layer of conductive strips 90. .Atop the second layer of probes 88 is placed a second ring 92 which is adhesively bonded in place. As a result, this embodiment can interface to integrated circuits with double rows of contact pads. or very closely spaced pads.

Figure 11:
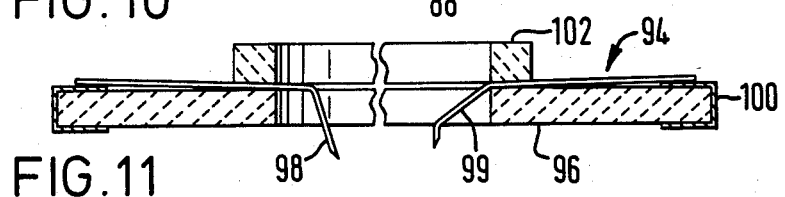
FIG. 11 is a cross-section of another embodiment of a probe device that utilizes a flat dielectric ring.

Another embodiment of a probe disk according to the present invention is shown in FIG. 11. This particular probe disk 94 uses a flat substrate 96 and probes 98 with longer tops. Alternatively, the probes can be formed as indicated at 99. In a manner similar to that described above, the probes 98 (and 99) are soldered to conductive strips 100 around the periphery of the substrate 96 and a ring 102 is adhesively bonded to the tops of the probes to provide a strain relief.

The probe device described above has many advantages apart from the ease and speed with which it may be manufactured. In the prior art the printed circuit board 4 is often stressed when it is in a testing machine and this causes the probes 1 to bend. They typically have to be adjusted by hand when the test card is mounted in a jig simulating the testing machine. In the arrangement of the invention, however, the probes and ceramic rings may be substantially unstressed and so such adjustment is unnecessary. The use of a ceramic ring 10 enables high temperature printing of the tracks 17 which gives tracks of low resistance which is of advantage especially at high frequencies. The probe device is stronger than in the prior art because the probes are supported by rings on both sides. It was not unusual in the prior art for probes to split out or become loose from the epoxy resin 3. Finally, the probe device of the invention enables greatly reduced handling when in use on a testing machine and consequently the risk of contamination of the dice is reduced. The accuracy with which the probe device can be manufactured avoids or reduces the need for readjustment of the testing machine when the probe device is changed.

The double decking arrangement allows a very large number of pads to be contacted. Typically in the prior art large numbers of probes could only be provided by making two or more probe devices and fixing them one on top of the other. The serious alignment difficulties of this approach are overcome by the present invention in which all of the probes are fixed in position whilst in contact with the pads.

As will be clear to those skilled in the art, alterations and modifications may be made to the disclosed embodiments withOut departing from the inventive concepts thereof. The above description is therefore intended to be illustrative and informative rather than limiting in scope. Accordingly, it is intended that the following claims be interpreted as covering all such alterations and modifications that reasonably fall within the true spirit and scope of the invention.

What is claimed is:

1. A probe device for testing an integrated circuit, comprising a dielectric ring of which one axial face is inclined to the axis in a conical manner, a plurality of elongaged resilient probes positioned on said inclined face with their contact tips radially within the aperture in the ring, and a second dielectric ring, having a generally complementary inclined face, positioned on the probes whereby the probes are retained between the two rings and the effective resilient length of each of said probe is determined by its point of engagement with said second ring.

2. A probe device as claimed in claim 1 wherein the rings are formed of a ceramic material.

3. A probe device as claimed in claim 1 wherein a plurality of conductive tracks for the respective probes are formed directly on the first-mentioned dielectric ring and the probes are soldered to the tracks for connection to a testing apparatus.

4. A probe device as claimed in claim 1 wherein said first-mentioned ring includes locating holes to aid in positioning the device with respect to said integrated circuit to be tested.

5. A method of making a probe device for testing an integrated circuit, comprising positioning a first dielectric ring adjacent and around an integrated circuit of the kind to be tested, said first dielectric ring having an upper axial face inclined to the axis in a concave conical manner, positioning a plurality of elongated probes with a manipulator device such that the probes lie on or over the upper axial face of said first dielectric ring and the probe tips contact the desired parts of the integrated circuit radially within the aperture in the ring, securing the probes to the ring with an adhesive, and securing a second dielectric ring having a lower axial face inclined to the axis in a convex manner to the probes whereby the probes are secured between the two rings and the effective resilient length of each of said probes is determined by its point of engagement with said second ring.

6. A method as claimed in claim 5 comprising the step of soldering the probes to respective conductive tracks provided on the first-mentioned ring before the second ring is secured.

7. A method as claimed in claim 5 comprising the step of soldering the probes to respective conductive tracks provided on the first-mentioned ring after the second ring is secured.

8. A method as claimed in claim 5 wherein the second ring is secured to the first ring and the probes by means of an epoxy resin.

9. A probe disk for enabling electrical connection to be made to the contact pads of an integrated circuit to be tested, said probe disk comprising:
   a disk-shaped substrate formed of an electrically insulative material and including an opening centered at its axis and conductive strips disposed in spaced-apart relationship about its periphery, the surface of said substrate being inclined to the axis in a conical manner;
   an array of elongated resilient probes each including a contact end and a mounted end, each said probe being disposed on the top surface of said substrate such that its mounting end is electrically coupled to one of said conductive strips and its contact end protrudes into and through said opening to a location corresponding to the position of one of the contact pads of an integrated circuit to be tested; and
   a ring formed of an electrically insulative material and having a bottom surface inclined to the axis in a conical manner and affixed to the top of said array of probes and said substrate such that said array of probes is sandwiched between said ring and said substrate, the diameter of the opening in said ring being no greater than the diameter of the opening in said substrate whereby the effective resilient length of each said probe is determined by its point of engagement with said ring.

10. A probe disk as recited in claim: 9 wherein each probe of said array of probes is adhesively bonded to the surface of said substrate and the mounting end of each probe is soldered to one of said conductive strips.

11. A probe disk as recited in claim 9 wherein said probe disk includes locating holes to aid in positioning said probe disk with respect to said integrated circuit to be tested.

12. A probe disk as recited in claim 9 and further comprising:
   a second array of probes with each probe disposed upon the top surface of said ring such that its contact end protrudes into and through said opening to a location corresponding to one of said contact pads of said integrated circuit to be tested; and
   a second ring of an electrically insulative material affixed to the top of said second array of probes such that said second array of probes is sandwiched between said first-mentioned and second rings.

13. A probe disk for enabling electrical connection to be made to the contact pads of an integrated circuit to be tested, said probe disk comprising:
   a disk-shaped substrate formed of an electrically insulative material and including a central opening and conductive strips disposed in spaced-apart relationship about the outer perimeter of the substrate, the top surface of said substrate being frusto-conical in shape to form a generally concave upper disk surface;
   a first array of elongated resilient probes each including a contact end and a mounting end, each said probe being disposed on the frusto-conical top surface of said substrate such that its mounting end is electrically coupled to one of said contact strips and its contact end protrudes into and through said opening to a location corresponding to the position of one of the said opening to a location corresponding to the position of one of the contact pads of an integrated circuit to be tested; and
   a first ring formed of an electrically insulative material and having a bottom surface frusto-conical in shape to form a generally convex surface matingly engaging and being affixed to the top of said first array of probes and said upper disk surface such that said first array of probes is sandwiched between said first ring and said substrate and the effective resilient length of each of said probes is determined by its point of engagement with said first ring.

14. A probe disk as recited in claim 13 wherein each probe of said first array of probes is adhesively bonded to the surface of said substrate and the mounting end of each probe is soldered to one of said conductive strips.

15. A probe disk as recited in claim 13 wherein said substrate includes locating holes to aid in positioning said probe disk with respect to an integrated circuit to be tested.

16. A probe disk as recited in claim 13 and further comprising:
   a second array of probes with each probe disposed upon the top surface of said first ring such that its contact end protrudes into and through said opening to a location corresponding to one of said contact pads of an integrated circuit to be tested; and a second ring of an electrically insulative material affixed to the top of said second array of probes and said first ring such that said second array of probes is sandwiched between said first and second rings.

17. A probe disk as recited in claim 13 wherein the inner diameter of said first ring is substantially less than the diameter of said central opening.

* * * * *